US010455642B2

(12) United States Patent
Rao et al.

(10) Patent No.: US 10,455,642 B2
(45) Date of Patent: Oct. 22, 2019

(54) RAPID THERMAL PROCESSING CHAMBER WITH LINEAR CONTROL LAMPS

(71) Applicant: Applied Materials, Inc., Santa Clara, CA (US)

(72) Inventors: Preetham Rao, Bangalore (IN); Abhilash J. Mayur, Salinas, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 780 days.

(21) Appl. No.: 15/012,885

(22) Filed: Feb. 2, 2016

(65) Prior Publication Data

US 2016/0234881 A1 Aug. 11, 2016

Related U.S. Application Data

(60) Provisional application No. 62/112,368, filed on Feb. 5, 2015.

(51) Int. Cl.
*H05B 3/00* (2006.01)
*F27B 17/00* (2006.01)
(Continued)

(52) U.S. Cl.
CPC ....... *H05B 3/0047* (2013.01); *F27B 17/0025* (2013.01); *F27D 5/0037* (2013.01); *H01L 21/67115* (2013.01); *H01L 21/67248* (2013.01)

(58) Field of Classification Search
CPC ............. F27D 5/0037; H01L 21/67115; H01L 21/67248; F27B 17/0025; H05B 3/0047
(Continued)

(56) References Cited

U.S. PATENT DOCUMENTS 4,556,786 A * 12/1985 Frost .................. H05B 3/06
219/459.1
5,252,132 A * 10/1993 Oda ..................... C23C 16/481
118/715
(Continued)

FOREIGN PATENT DOCUMENTS

KR 1020100079168 7/2010
KR 10-2012-0070200 6/2012
(Continued)

OTHER PUBLICATIONS

International Search Report dated Apr. 22, 2016 for Application No. PCT/US2016/012872.

*Primary Examiner* — Dana Ross
*Assistant Examiner* — Ket D Dang
(74) *Attorney, Agent, or Firm* — Patterson + Sheridan LLP

(57) ABSTRACT

A lamphead for thermal processing of a substrate is provided. The lamphead includes a housing having a first edge surrounding a first plane. The lamphead further includes a plurality of segmented lamps disposed within the housing, each segmented lamp aligned substantially parallel to the first plane. Each segmented lamp includes a first end connected to a location on the housing; a first wire segment connected to the first end; a first filament connected to the first wire segment; an intermediate wire segment connected to the first filament; a second filament connected to intermediate wire segment; a second wire segment connected to the second filament; and a second end connected to the second wire segment; where the second end is connected to an opposing location on the housing.

20 Claims, 6 Drawing Sheets

(51) Int. Cl.
*F27D 5/00* (2006.01)
*H01L 21/67* (2006.01)

(58) Field of Classification Search
USPC ........ 392/411, 416, 417, 422, 430; 219/390, 219/405, 411
See application file for complete search history.

(56) References Cited

U.S. PATENT DOCUMENTS

| | | | | |
|---|---|---|---|---|
| 6,465,761 | B2* | 10/2002 | Stevens | C23C 16/481 118/501 |
| 2004/0089649 | A1* | 5/2004 | Falter | H01L 21/67115 219/444.1 |
| 2006/0197454 | A1* | 9/2006 | Mizukawa | H01K 7/00 315/46 |
| 2007/0104470 | A1* | 5/2007 | Aderhold | F27B 17/0025 392/422 |
| 2007/0120227 | A1* | 5/2007 | Suzuki | H01L 21/67115 257/620 |
| 2008/0219650 | A1* | 9/2008 | Suzuki | H01L 21/67109 392/408 |
| 2009/0101633 | A1* | 4/2009 | Aggarwal | F27B 17/0025 219/385 |
| 2009/0103905 | A1* | 4/2009 | Tanino | H01K 1/14 392/411 |
| 2009/0139977 | A1* | 6/2009 | Falter | H01L 21/67115 219/405 |
| 2009/0214193 | A1* | 8/2009 | Suzuki | H01L 21/67115 392/411 |
| 2010/0054719 | A1* | 3/2010 | Mizukawa | H01K 1/38 392/411 |
| 2014/0235071 | A1 | 8/2014 | Cheng et al. | |

FOREIGN PATENT DOCUMENTS

| | | |
|---|---|---|
| KR | 1020130128859 | 11/2013 |
| KR | 1020140018915 | 2/2014 |

* cited by examiner

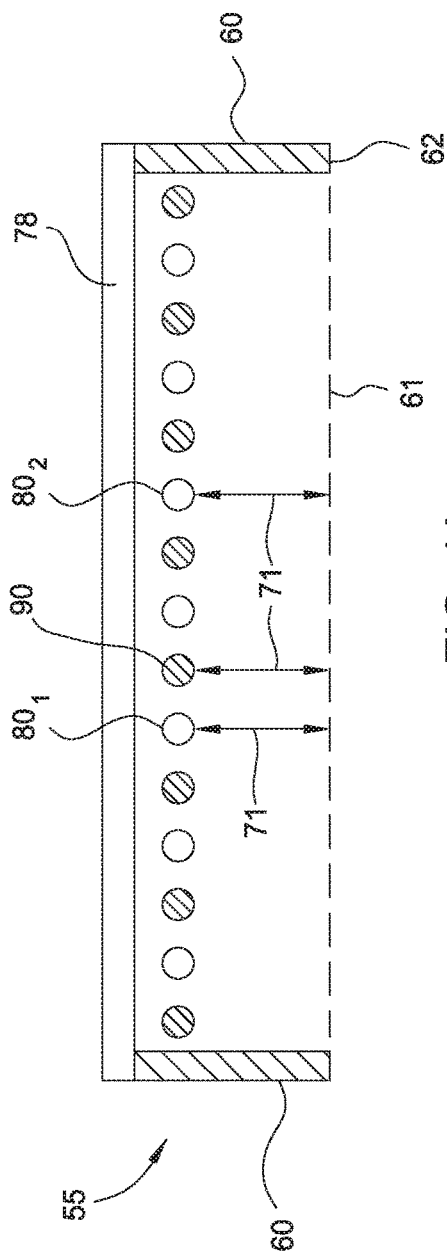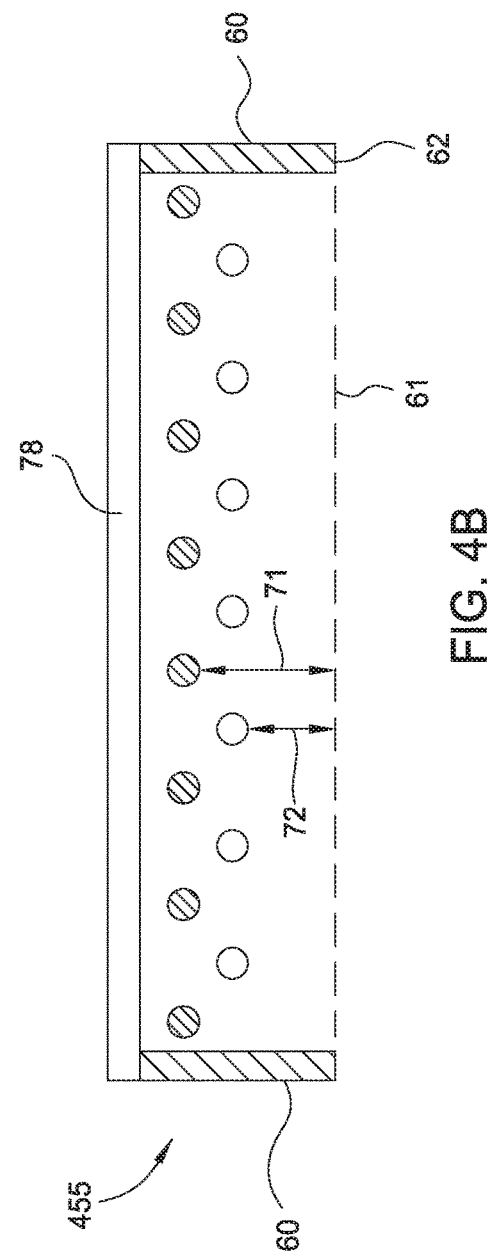

RAPID THERMAL PROCESSING CHAMBER WITH LINEAR CONTROL LAMPS

CROSS-REFERENCE TO RELATED APPLICATIONS

This application claims benefit of U.S. provisional patent application Ser. No. 62/112,368, filed Feb. 5, 2015, which is hereby incorporated herein by reference.

BACKGROUND

Field

Embodiments disclosed herein generally relate to thermal processing of semiconductor substrates. More specifically, embodiments disclosed herein are related to rapid thermal processing lamps for thermal processing of semiconductor substrates.

Description of the Related Art

Rapid thermal processing (RTP) is one thermal processing technique that allows rapid heating and cooling of a substrate, such as a silicon wafer. RTP substrate processing applications include annealing, dopant activation, rapid thermal oxidation, and silicidation among others. Typical peak processing temperatures can range from about 450° C. to 1100° C. The heating is typically done in a RTP chamber with numerous lamps disposed in a lamphead above or below the substrate being processed.

These numerous individual lamps are often arranged in a matrix or honeycomb formation in the RTP lamphead of the RTP chamber. This matrix arrangement allows for individual adjustment of the power provided to the different lamps in order to control the temperature over the regions of the substrate, such as radial regions of a surface of the substrate being annealed. Although this matrix arrangement of RTP lamps can be effectively used for thermal processing of substrates, each individual lamp incrementally adds material costs as well as maintenance costs for the end user of the RTP chamber.

Therefore, there is a need for an improved and more efficient RTP lamp arrangement.

SUMMARY

Embodiments of the disclosure are generally related to rapid thermal processing lamps for thermal processing of semiconductor substrates. In one embodiment, a lamphead for thermal processing of a substrate is provided. The lamphead includes a housing having a first edge surrounding a first plane. The lamphead further includes a plurality of segmented lamps disposed within the housing, and each segmented lamp is aligned substantially parallel to the first plane. Each segmented lamp includes a first end connected to a location on the housing; a first wire segment connected to the first end; a first filament connected to the first wire segment; an intermediate wire segment connected to the first filament; a second filament connected to intermediate wire segment; a second wire segment connected to the second filament; and a second end connected to the second wire segment; wherein the second end is connected to an opposing location on the housing.

In another embodiment, a lamphead for thermal processing of a substrate is provided. The lamphead includes a housing having a first edge surrounding a first plane. The lamphead further includes an arrangement of lamps located within the housing and disposed across an area facing the first plane and at least substantially as large as the first plane, the area defined by a boundary, wherein the arrangement includes a plurality of segmented lamps, each segmented lamp extending from a location on the boundary to an opposing location on the boundary, wherein each segmented lamp includes a midpoint, a first filament on a first side of the midpoint, and a second filament on a second side of the midpoint.

In another embodiment, a thermal processing chamber for processing a substrate is provided. The thermal processing chamber includes one or more side walls surrounding a processing region; a substrate support within the processing region; a transparent window disposed above the one or more side walls; and a lamphead disposed above the transparent window. The lamphead includes a housing having a first edge surrounding a first plane. The lamphead further includes a plurality of segmented lamps disposed within the housing, each segmented lamp aligned substantially parallel to the first plane. Each segmented lamp includes a first end connected to a location on the housing; a first wire segment connected to the first end; a first filament connected to the first wire segment; an intermediate wire segment connected to the first filament; a second filament connected to intermediate wire segment; a second wire segment connected to the second filament; and a second end connected to the second wire segment; wherein the second end is connected to an opposing location on the housing.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 4A is a side sectional view of a lamphead, according to one embodiment.

FIG. 4B is a side sectional view of a lamphead, according to another embodiment.

To facilitate understanding, common words have been used, where possible, to designate identical elements that are common to the figures. It is contemplated that elements disclosed in one embodiment may be beneficially utilized on other embodiments without specific recitation.

DETAILED DESCRIPTION

The present disclosure relates generally to thermal processing of semiconductor substrates. More specifically, embodiments disclosed herein are related to rapid thermal processing lamps for thermal processing of semiconductor substrates.

Figure 1:
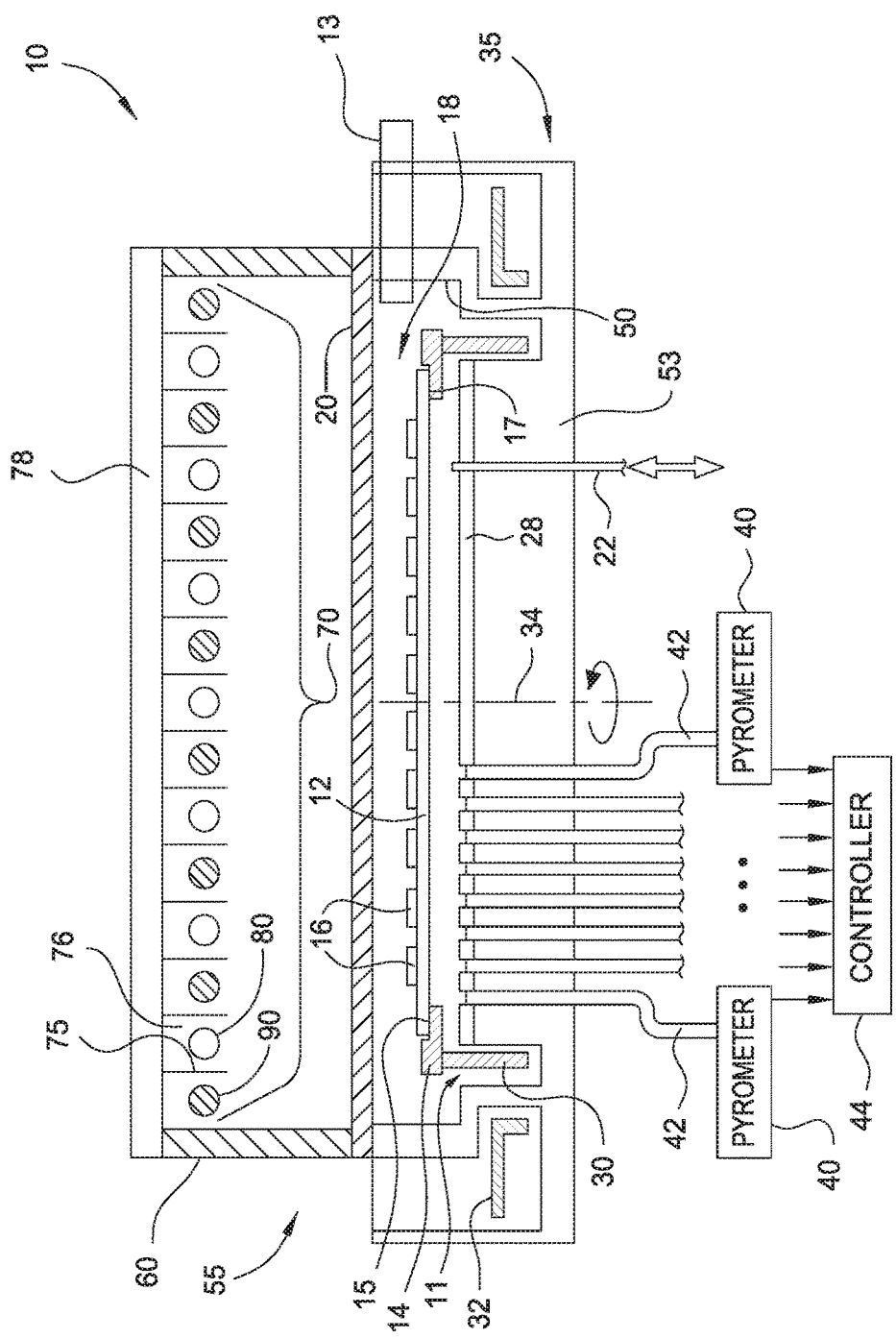
FIG. 1 is a side sectional view of a thermal processing chamber, according to one embodiment.

FIG. 1 illustrates a cross-sectional view of a thermal processing chamber 10. The thermal processing chamber 10 can be used for rapid thermal processing (RTP) of substrates. As used herein, rapid thermal processing or RTP refers to an apparatus or a process capable of uniformly heating a substrate at rates of about 50° C./second and higher, for example, at rates of about 100° C./second to 150° C./second, and about 200° C./second to 400° C./second. Typical ramp-down (cooling) rates in RTP chambers are in the range of about 80° C./second to 150° C./second, but may also be outside this range.

The thermal processing chamber 10 includes one or more side walls 50 surrounding and/or enclosing a processing region 18 for thermally treating a substrate 12, such as a silicon substrate. The thermal processing chamber 10 includes a base 53 supporting the one or more side walls 50. The thermal processing chamber 10 may further include a transparent window 20 disposed above the one or more side walls 50, a lamphead 55 disposed above the transparent window 20, and a reflector 78 disposed above the lamphead 55. "Transparent", as used herein, means most radiation of a given wavelength is transmitted. Thus, a "transparent" object, as used herein, is an object that transmits most incident radiation of a given wavelength of interest. As used herein, if an object is "transparent" to visible light, that object transmits most incident light of a visible wavelength. Likewise, if an object is "transparent" to infrared light, that object transmits most incident light of an infrared wavelength.

A substrate support 11 is located within the processing region 18. The substrate support 11 may be rotatable. The substrate support 11 comprises an annular support ring 14 and a rotatable support cylinder 30. A rotatable flange 32 may be positioned outside the processing region 18 and magnetically coupled to the support cylinder 30. An actuator (not shown) can be used to rotate the flange 32 about a centerline 34 of the thermal processing chamber 10. In other embodiments, the bottom of the support cylinder 30 may be magnetically levitated and rotated by a rotating magnetic field in coils surrounding the support cylinder 30.

The substrate 12 is supported on its periphery by the annular support ring 14 of the substrate support 11. An edge lip 15 of the annular support ring 14 extends inward and contacts a portion of the backside of the substrate 12 on a substrate supporting surface 17 of the edge lip 15. The substrate 12 may be oriented such that features 16 already formed on a front surface of the substrate 12 face towards the lamphead 55.

A port 13 to the processing region 18 of the thermal processing chamber 10 can be used to transfer substrates to and from the thermal processing chamber 10. A plurality of lift pins 22, such as three lift pins, may be extended and retracted to support the back side of the substrate 12 when the substrate 12 is disposed in, or removed from, the thermal processing chamber 10. Alternately, the plurality of lift pins 22 may remain stationary while the substrate support 11 is moved to effect extension and retraction of the lift pins relative to the substrate support.

The processing region 18 is defined on its upper side by the transparent window 20. In some embodiments, the transparent window 20 is a transparent quartz window. The transparent window 20 separates the lamphead 55 from the processing region 18.

The lamphead 55 is used to heat the substrate 12 during thermal processing. The lamphead 55 includes a housing 60 and an arrangement of lamps 70 disposed within the housing 60. The housing can be made of stainless steel or other suitable material. The arrangement of lamps 70 includes a plurality of segmented lamps 80 and a plurality of linear lamps 90. Examples of suitable lamps to be used as the segmented lamps 80 and the linear lamps 90 can include tungsten-halogen lamps and mercury vapor lamps. The linear lamps 90 can be used to provide a majority of the heat used to raise the temperature of the substrate 12, such as between about 60% and about 95% of the heat, such as about 80% of the heat. The segmented lamps 80 can be used to provide the remainder of heat to the substrate 12, such as between about 5% and about 40%, such as about 20%.

Each segmented lamp 80 can be configured to direct most of its heat to control the temperature of a particular zone on the substrate 12, such as to a ring-shaped zone on the substrate 12 as the substrate 12 is rotated by a rotatable substrate support. The segmented lamps 80 and linear lamps 90 can be arranged in any convenient pattern. For example, the segmented lamps 80 and the linear lamps 90 may be arranged with one segmented lamp 80 adjacent to two linear lamps 90, one linear lamp 90 on each side of the segmented lamp 80. Such an arrangement may have a segmented lamp 80 or a linear lamp 90 at either edge of the arrangement. Alternately, the segmented lamps 80 and linear lamps 90 may be arranged with two adjacent segmented lamps 80 in a pair of segmented lamps 80, with one linear lamp 90 adjacent to each side of the pair of segmented lamps 80. Other arrangements may be easily envisioned. Moreover, in some embodiments, all of the lamps in the lamphead 55 could be segmented lamps 80.

The radiation emitting elements, for example the filaments, of the segmented lamps 80 can be arranged in to zones, for example radial zones, corresponding to areas of a substrate 12 on the substrate support 11 to be heated. One or more sensors, such as pyrometers, may be used to monitor the different zones allowing separate temperature control of different regions of a substrate. For, example more heat may be provided to outer edges of a substrate when heating due to the increased surface area around the edges of a substrate. The segmented lamps 80, and/or the emitters of the segmented lamps 90, may be arranged to provide any desired shape or profile of zones, for example linear zones across the arrangement 70 from one edge to the other edge of the arrangement 70, or square or rectangular zones, which may be concentric or acentric. Further details on arrangements of lamps 70, the segmented lamps 80, and the linear lamps 90, are discussed below in reference to FIGS. 2A-4B.

A reflector 78 can be placed above the housing 60 of the lamphead 55 to reflect radiation back towards the substrate 12. The surface of the reflector 78 can be plated with a reflective material, such as gold, aluminum, or stainless steel, such as polished stainless steel. Each lamp 80, 90 can be disposed in a reflective cavity 76. Each reflective cavity could be defined on the top by a portion of the reflector 78 and on either side by a reflective structure 75. The reflective structures 75 can direct, focus, and/or shape the radiation of the lamps 80, 90 in any intended way.

The reflector 78 can further include cooling channels (not shown) to help remove excess heat from the lamphead 55 and to assist in the cooling rates of the substrate 12 after heating by use of a coolant, such as cooling water. In some embodiments, these cooling channels or separate cooling channels (not shown) can extend into the housing 60 of the lamphead 55 to further assist in cooling the lamphead 55 and substrate 12 by use of a coolant, such as cooling water. Although the reflector 78 is shown having a substantially flat shape, in some embodiments the reflector 78 can have a concave shape. Furthermore, in some embodiments, multiple concave reflectors can be used.

The processing region 18 is defined on its lower side by the base 35 of the thermal processing chamber 10. The base 35 can include a reflector 28 that is beneath the edge lip 15 of the annular support ring 14. The reflector 28 may extend parallel to and over an area greater than the surface of the substrate 12 facing the reflector 28. The reflector 28 reflects radiation emitted from the substrate 12 back toward the substrate 12 to enhance the apparent emissivity of the substrate 12. The spacing between the substrate 12 and the reflector 28 may be between about 3 mm to 9 mm, and the aspect ratio of the width to the thickness of the cavity may be greater than 20. The top surface of the reflector 28 may be made of aluminum and may have a surface coating made of a different material, for example a highly reflective material such as silver or gold, or a multi-layer dielectric mirror. The top surface of the reflector 28 and the back side of the substrate 12 form a reflecting cavity for enhancing the effective emissivity of the substrate 12 to improve the accuracy of temperature measurements. In some embodiments, the reflector 28 may have a more irregular or textured top surface, or may have a black or other colored top surface to more closely resemble a black-body wall. The reflector 28 may be disposed on the base 35. The base 35 can include cooling channels (not shown) to remove excess heat from the substrate 12. These cooling channels can be used especially during cool down of the substrate 12 by use of a coolant, such as cooling water.

The base 35 further includes a plurality of temperature sensors 40, shown as pyrometers, to measure the temperature across a radius of the rotating substrate 12. Each sensor 40 is coupled through an optical light pipe 42 and an aperture in the reflector 28 to face the back side of the substrate 12. The light pipes 42 may be formed of various structures including sapphire, metal, and silica fiber.

A controller 44 may be used to control the temperature of the substrate 12 during processing. The controller 44 can be used to supply a relatively constant amount of power to the linear lamps 90 during a particular step of a thermal process. The controller 44 can change the amount of power supplied to the linear lamps 90 for different substrates or different thermal processing steps performed on a same substrate. The controller 44 uses the signals from the sensors 40 as input to control the temperature of different radial zones on the substrate 12. The controller 44 adjusts the voltages supplied to the different segmented lamps 80 to dynamically control the radiant heating intensity and pattern during the processing. In some embodiments, the segmented lamps 80 and the linear lamps 90 are powered with a DC power supply while in other embodiments, the lamps 80, 90 can be powered with an AC power supply and a rectifier, such as SCR can be used to supply the power to the lamps 80, 90.

Pyrometers generally measure light intensity in a narrow wavelength bandwidth of, for example, 40 nm in a range between about 700 to 1000 nm. The controller 44 or other instrumentation converts the light intensity to a temperature through the well-known Planck distribution of the spectral distribution of light intensity radiating from a black-body held at that temperature. Pyrometry, however, is affected by the emissivity of the portion of the substrate 12 being scanned. Emissivity e can vary between 1 for a black body to 0 for a perfect reflector and thus is an inverse measure of the reflectivity $R=1-\epsilon$ of the substrate back side. While the back surface of a substrate 12 is typically uniform so that uniform emissivity is expected, the backside composition may vary depending upon prior processing. The pyrometry can be improved by further including a emissometer (not shown) to optically probe the substrate (12) to measure the emissivity or reflectance of the portion of the substrate 12 facing the emissometer in the relevant wavelength range and the control algorithm within the controller 44 to include the measured emissivity.

While the thermal processing chamber 10 shows a top heating configuration (i.e., lamps 80, 90 provided above the substrate 12), it is contemplated that a bottom heating configuration (i.e., heating lamps provided below the substrate) may also be utilized to benefit from the present disclosure. Furthermore, in some embodiments, the front surface of the substrate 12 with the processed features 16 formed 15 thereon may face away from the lamphead 55, (i.e., facing towards the sensors 40) during processing.

Figure 2A:
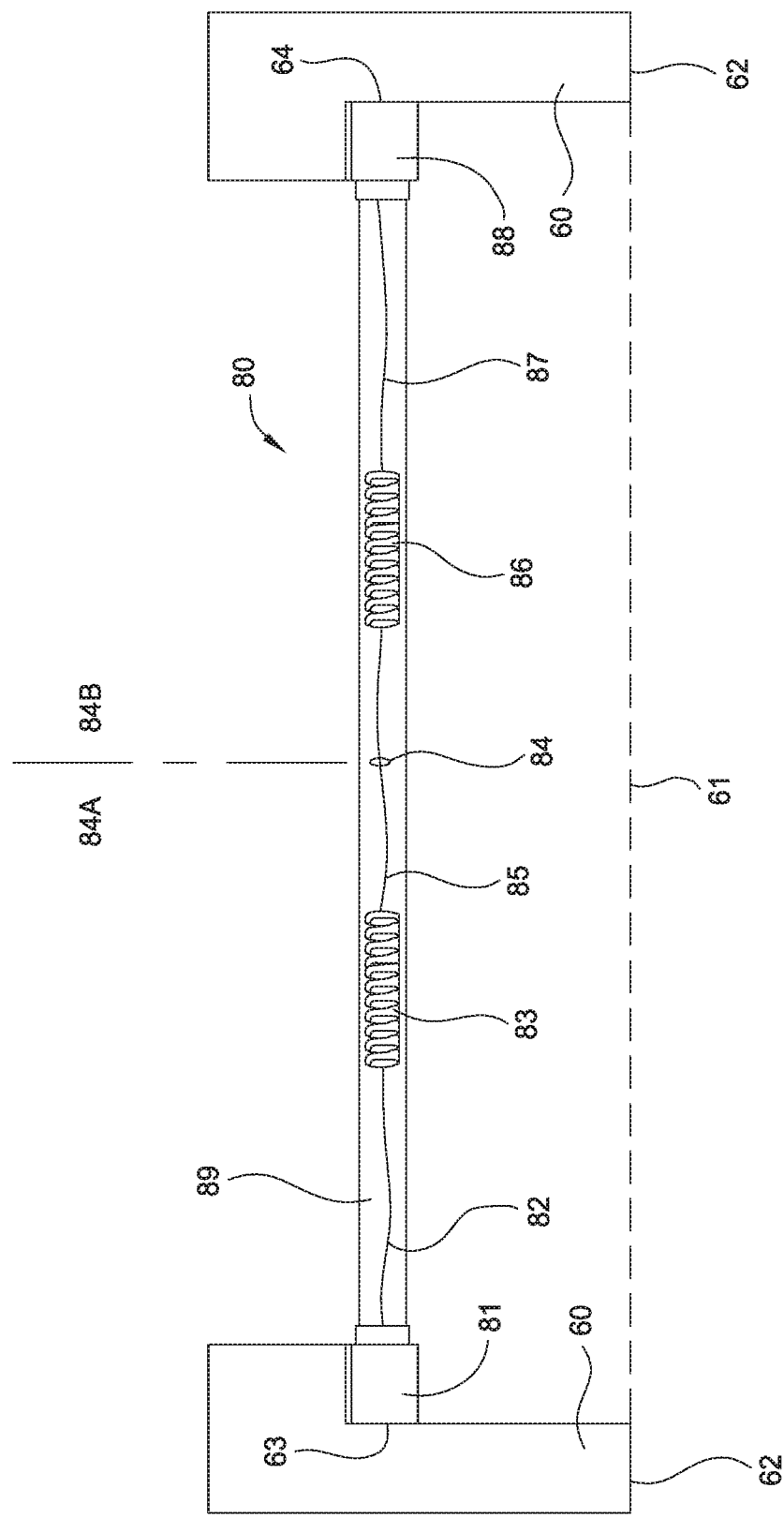
FIG. 2A is a side sectional view of a segmented lamp, according to one embodiment.

FIG. 2A shows a side sectional view of one of the segmented lamps 80 in the housing 60 of the lamphead 55, according to one embodiment. The housing 60 includes a first edge 62 surrounding a first plane 61, where the first plane 61 can be an opening for directing heat towards the substrate 12 (i.e., the arrangement of lamps 70 including the segmented lamps 80 and the linear lamps 90 may be oriented to direct heat towards a substrate 12 through the first plane 61). In FIG. 2A, the substrate would be facing the first plane 61. The first plane 61 can be covered by the transparent window 20 of FIG. 1. Each segmented lamp 80 can substantially span a dimension across the first plane 61. For example, if the first plane 61 is substantially rectangular, each segmented lamp 80 could span the length or width of the first plane 61. As another example, if the first plane 61 is substantially circular, then a central lamp could span a diameter of the first plane 61 and other segmented lamps 80 could span various chords across the first plane 61.

In some embodiments, each segmented lamp 80 has a length that is slightly shorter, slightly longer, or about the same length as a dimension across the first plane 61. Each segmented lamp 80 includes a first end 81 that may be connected to a location (e.g., location 63) on the housing 60, a first wire segment 82 connected to the first end 81, a first filament 83 connected to the first wire segment 82, and an intermediate wire segment 85 connected to the first filament 83. Each segmented lamp 80 further includes a second filament 86 connected to the intermediate wire segment 85, a second wire segment 87 connected to the second filament 86, and a second end 88 connected to the second wire segment 87, wherein the second end 88 is connected to an opposing location (e.g., location 64) on the housing 60. Electrical connections can be provided to each segmented lamp 80 at the first end 81 and the second end 88. A bulb 89 connected to the first end 81 and the second end 88 surrounds the wires and filaments of each segmented lamp 80.

The lengths of the different wires 82, 85, 87 in the segmented lamps 80 can be varied to adjust the positions of the filaments 83, 86 in the segmented lamp 80, so that the filaments 83, 86 can be disposed over different radials zones of the substrate 12. Each segmented lamp 80 further includes a midpoint 84. The first filament 83 is on a first side 84A of the midpoint 84, and the second filament 86 is on a second side 84B of the midpoint 84. Although FIG. 2A shows the segmented lamp 80 connected to the housing 60, in other embodiments the segmented lamps 80 can be attached to another support structure, such as a structure mounted above the housing 60, such as a structure fixed to the top of the housing 60.

Figure 2B:
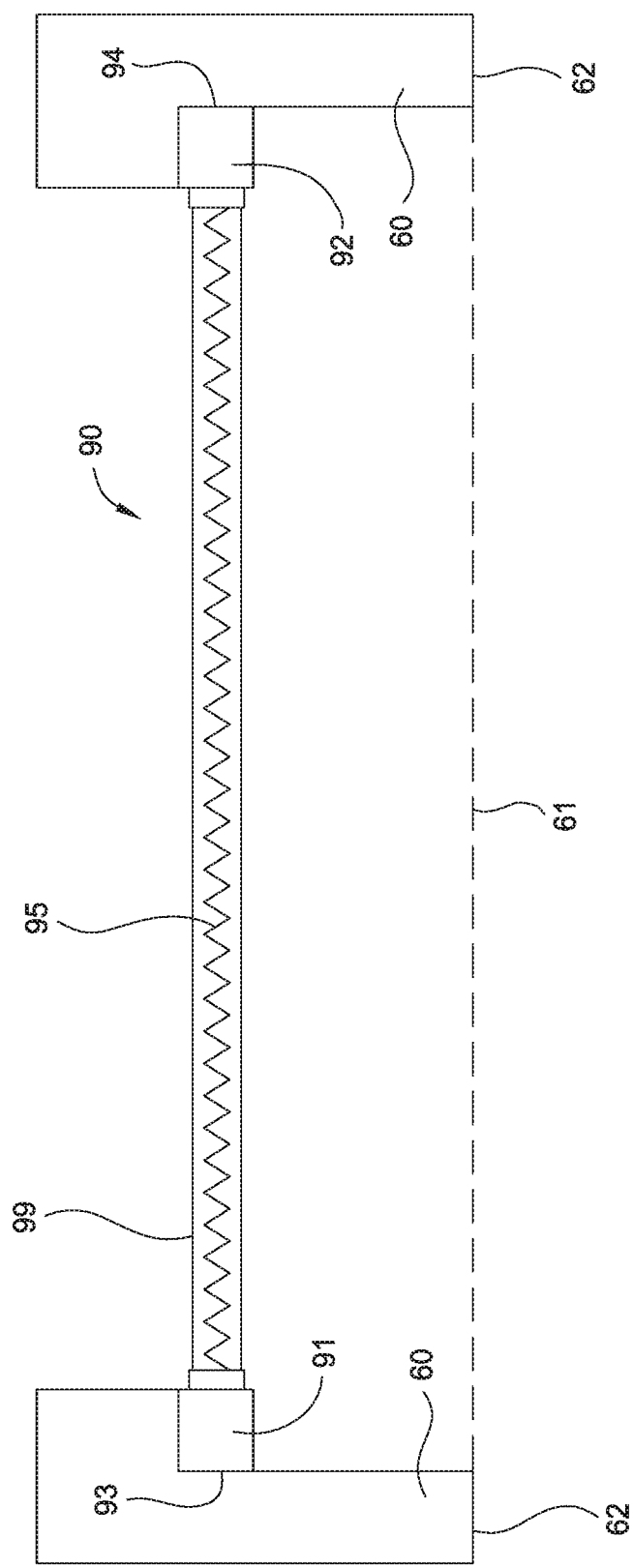
FIG. 2B is a side sectional view of a linear lamp, according to one embodiment.

FIG. 2B shows a side sectional view of one of the linear lamps 90 in the housing 60 of the lamphead 55, according to one embodiment. Each linear lamp 90 can substantially span a dimension of the first plane 61 in a similar way to the segmented lamps 80 described above. In some embodiments, each segmented lamp has a length that is slightly shorter, slightly longer or about the same length as a dimension of the first plane 61. Each linear lamp 90 includes a filament 95 extending from a first end 91 to a second end 92 of the linear lamp 90, wherein the first end 91 and the second end 92 of each linear lamp 90 are each connected to the housing 60 at opposing locations (e.g., locations 93, 94).

Electrical connections can be provided to each linear lamp 90 at the first end 91 and the second end 92. A bulb 99 connected to the first end 91 and the second end 92 surrounds the wires and filaments of each linear lamp 90. Although FIG. 2B shows the linear lamp 90 connected to the housing 60, in other embodiments the linear lamps 90 can be attached to another support structure, such as a structure mounted above the housing 60, such as a structure fixed to the top of the housing 60.

Figure 3A:
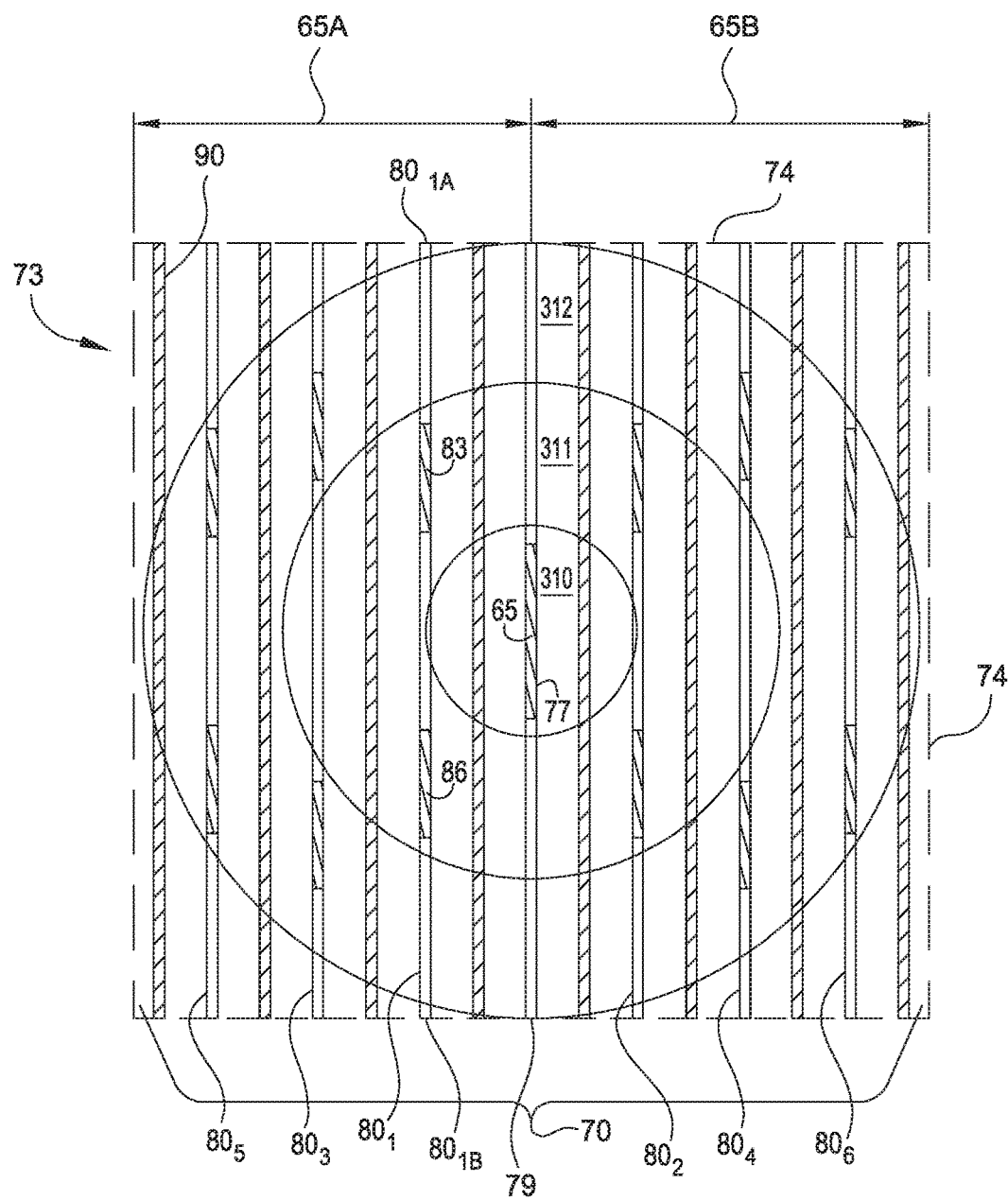
FIGS. 3A and 3B are top plan views of an arrangement of lamps, according to one embodiment.

FIG. 3A is a top plan view of the arrangement of lamps 70, according to one embodiment. Referring to FIG. 3A, the arrangement of lamps 70 is disposed across an area 73 facing the first plane 61 (see FIG. 2A) and may be at least as large as the first plane 61. In some embodiments, the area 73 can slightly smaller, slightly larger or the same size as the first plane 61. The area 73 is defined by a boundary 74. Each segmented lamp 80 in the arrangement of lamps 70 can extend from a location (e.g., location 80$_{1A}$) on the boundary 74 to an opposing location (e.g., location 80$_{1B}$) on the boundary 74. In some embodiments, the boundary 74 coincides with a surface of the housing 60, so that the lamps 80, 90 can be mounted to the housing 60. In other embodiments, the area 73 can be larger or smaller than an area enclosed by the housing 60. For example, in some embodiments the lamps can be mounted from a separate support structure above the housing 60 allowing the arrangement of lamps 70 to cover a different area than the area enclosed by the housing 60. The area 73 is shown as a rectangular area, but the area 73 can take different shapes, such as square or circular area to match or more closely match the areas enclosed by the housing 60 or the first plane 61. In a circular embodiment, the lamps 80, 90 can be different lengths to accommodate the varying distances from one side of the housing 60 to an opposing side of the housing 60, and to similarly accommodate the varying distances from one side of the first plane 61 to an opposing side of the first plane 61.

The arrangement of lamps 70 includes 6 segmented lamps 80$_1$-80$_6$, 8 linear lamps 90, and a central lamp 79. Other embodiments may contain more or less segmented lamps 80 or linear lamps 90. Furthermore in some embodiments, the central lamp 79 can be a segmented lamp 80 or a linear lamp 90.

Each segmented lamp 80 can be aligned parallel to the other segmented lamps 80 as well as parallel to the linear lamps 90 and the central lamp 79. The arrangement of lamps 70 shows the linear lamps 90 and the segmented lamps 80 mostly in an alternating order, but other arrangements can be used. For example, in some embodiments, the segmented lamps 80 can be aligned perpendicular to each linear lamp 90, where the segmented lamps 80 are disposed at a different distance from the first plane 61 of the housing 60 than the linear lamps 90 are from the first plane 61. A perpendicular configuration can provide additional room to cool the sides of the housing 60 as well as to connect wiring for each of the lamps 80, 90.

The filaments 83, 86 of the segmented lamps 80 can be arranged in zones, such as zones 310-312. The zones 310-312 can correspond to areas of the substrate 12 to be placed on the on the annular support ring 14 (see FIG. 1) or to the first plane 61 (see FIG. 2A). For example, the zones 310-312 can correspond to different temperature control regions of the substrate 12. A separate sensor 40, for example a pyrometer (see FIG. 1), can be placed beneath each zone 310-312 to be an input for a temperature control loop of each zone 310-312. Each zone 310-312 can further include at least one central lamp 79 or segmented lamp 80 having at least one filament only in that zone to be the output that the controller 44 (see FIG. 1) can adjust to control the temperature of the substrate in that zone 310-312.

The zones 310-312 include a central zone 310 surrounded by a first ring-shaped zone 311, which is surrounded by a second ring-shaped zone 312. The central zone 310 can include only one filament 77 in some embodiments to control the temperature of the center of the substrate 12. In other embodiments the central zone 310 can include two or more filaments from one or more lamps, such as segmented lamps 80. The first ring-shaped zone 311 includes four filaments 83, 86 from two segmented lamps 80$_1$, 80$_2$. The four filaments 83, 86 include two filaments from the first segmented lamp 80$_1$ and two filaments from the second segmented lamp 80$_2$. The second ring-shaped zone 312 includes eight filaments 83, 86 from four segmented lamps 80$_3$-80$_6$. The eight filaments 83, 86 include two filaments from each of the segmented lamps 80$_3$-80$_6$. The extra filaments in zone 312 can provide increased heat to control the temperature of outer zones (e.g., zone 312) that have more surface area and mass than inner zones (e.g., zones 310, 311). In some embodiments, the length of the filaments 83, 86 in the segmented lamps 80 in the outer zones can be increased relative to the lengths of the filaments 83, 86 in the inner zones, so that additional heat can be provided from each segmented lamps 80 in the outer zones. Although FIG. 3A shows the arrangement of lamps 70 including three zones, more or less zones can be used to arrange the filaments 83, 86 of the segmented lamps 80 over the substrate 12 to be thermally processed.

The housing 60 includes a center 65 and there are segmented lamps 80 and linear lamps 90 on either side of the center 65. For example, a first segmented lamp 80$_1$ is on a first side 65A of the center 65 and a second segmented lamp 80$_2$ is on a second side 65B of the center 65. The center 65 can also correspond to the center of the arrangement of lamps 70.

Figure 3B:
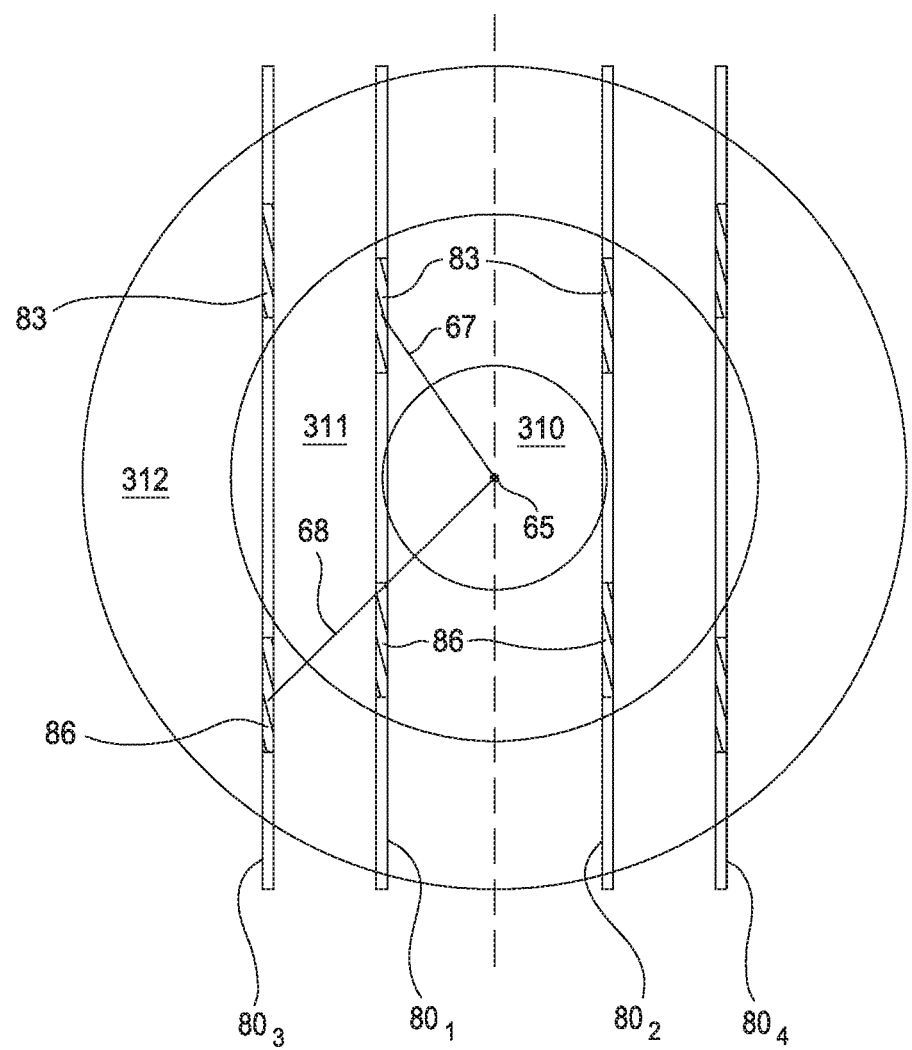

FIG. 3B shows the arrangement of lamps 70 with some of the lamps omitted so that some of the features of the lamps 80$_1$-80$_4$ can be explained in greater detail. For example, FIG. 3B shows the distances between the center 65 of the housing 60 and the filaments 83, 86 of the different segmented lamps 80$_1$-80$_4$. The filaments 83, 86 in the first segmented lamp 80$_1$ and the filaments 83, 86 in the second segmented lamp 80$_2$ are located at a first distance 67 from the center 65 (i.e., all four filaments 83, 86 are equidistant from the center 65). The filaments 83, 86 in a third segmented lamp 80$_3$ and the filaments 83, 86 in the fourth segmented lamp 80$_4$ are located at a second distance 68 from the center 65. The second distance 68 is longer than the first distance 67.

FIG. 4A is a side sectional view of the lamphead 55, according to the embodiment of FIG. 1. In lamphead 55, each segmented lamp 80 and each linear lamp 90 are a third distance 71 from the first plane 61 of the housing 60. Placing the lamps 80, 90 at a same distance from the first plane 61 of the housing 60 can simplify the design of the arrangement of lamps 70.

FIG. 4B is a side sectional view of a lamphead 455, according to another embodiment. In lamphead 455, each linear lamp 90 is a third distance 71 from the first plane 61 and each segmented lamp 80 is a fourth distance 72 from the first plane 61. The third distance 71 is longer than the fourth distance 72. Placing the segmented lamps 80 closer to the first plane 61 and thus closer to the substrate 12 being processed allows for each adjustment of a segmented lamp 80 to have a greater effect on the temperature of the substrate 12. This closer position of the segmented lamps 80 to the substrate 12 can improve the temperature control of the substrate 12 during processing. Although not shown, reflective structures 75 (see FIG. 1) could be placed between the lamps 80, 90, so that the radiation from each lamp 80, 90 does not interfere with another lamp 80, 90. The reflective structures 75 may extend down past the segmented lamps 80 from above the linear lamps 90 to prevent the interference.

The embodiments described herein illustrate a lamphead for use in a thermal processing chamber that can substantially reduce manufacturing costs as well as maintenance costs for the lamphead. The cost savings is achieved by reducing the number of lamps needed in the lamphead. Less lamps require less wiring and less time to mount in the lamphead. Furthermore, less lamps will result in less frequent replacement of lamps resulting in less downtime and maintenance. For example, some thermal processing lampheads include hundreds of lamps, such as over 400 lamps. Lamps eventually fail, so operating a thermal processing chamber with hundreds of lamps will require replacing hundreds if not thousands of lamps. In the embodiments disclosed herein, there can be as few as around 15 lamps, so it is likely that the amount of lamps that need replacement will be reduced by a factor of 10 or more when compared to conventional thermal processing lampheads.

Despite the cost savings, the lamp arrangements disclosed here can provide precise temperature control of different areas of the substrate during processing. For example, the segmented lamps can be arranged so that each segmented lamp only heats a particular radial zone of a rotating substrate. Furthermore, the segmented lamps can be shielded from the linear lamps using reflective structures, so that each segmented lamp can accurately control the temperature of the radial zone that the segmented lamp is heating. Moreover, as shown in FIG. 4B, the segmented lamps can be placed closer to the substrate further enhancing the ability of the segmented lamps to control the temperature across the different areas of the substrate.

While the foregoing is directed to embodiments of the present disclosure, other and further embodiments of the disclosure may be devised without departing from the basic scope thereof, and the scope thereof is determined by the claims that follow.

The invention claimed is:

1. A system for thermal processing of a substrate comprising:
   a substrate support;
   a housing positioned over the substrate support and having a first edge surrounding a first plane; and
   a plurality of segmented lamps disposed within the housing, each segmented lamp aligned parallel to the first plane, wherein each segmented lamp comprises:
      a first end connected to a first location on the housing;
      a first wire segment connected to the first end;
      a first filament connected to the first wire segment, the first filament extending from a first endpoint to a second endpoint;
      an intermediate wire segment connected to the first filament;
      a second filament connected to the intermediate wire segment, the second filament extending from a first endpoint to a second endpoint;
      a second wire segment connected to the second filament;
      a second end connected to the second wire segment, wherein the second end is connected to a second location on the housing; and
      a bulb extending linearly from the first end to the second end, wherein each segmented lamp is connected to a separate first location and a separate second location on the housing, wherein:
         the plurality of segmented lamps includes a first segmented lamp and a second segmented lamp,
         the first wire segment and the second wire segment of the first segmented lamp are configured to overlie an edge of the substrate disposed on the substrate support, the substrate having an outer ring-shaped zone in which the edge of the substrate is located and an inner ring-shaped zone, the outer ring-shaped zone surrounding the inner ring-shaped zone,
         the first endpoint and the second endpoint of the first filament and the second filament of the first segmented lamp are configured to overlie the inner ring-shaped zone of the substrate disposed on the substrate support, and
         the first endpoint and the second endpoint of the first filament and the second filament of the second segmented lamp are configured to overlie the outer ring-shaped zone of the substrate disposed on the substrate support.

2. The system of claim 1, wherein the plurality of segmented lamps further comprises a third segmented lamp, wherein the first segmented lamp is aligned parallel to the third segmented lamp, and the plurality of segmented lamps are oriented to direct heat towards the substrate through the first plane.

3. The system of claim 2, wherein the housing comprises a center and the first segmented lamp is on a first side of the center and the third segmented lamp is on a second side of the center.

4. The system of claim 2, wherein the housing comprises a center and the first and second filaments in the first segmented lamp and the first and second filaments in the third segmented lamp are each located at a first distance from the center.

5. The system of claim 4, wherein the plurality of segmented lamps further comprises a fourth segmented lamp and a fifth segmented lamp, wherein the first and second filaments in the fourth segmented lamp and the first and second filaments in the fifth segmented lamp are each located at a second distance from the center, wherein the second distance is longer than the first distance.

6. The system of claim 2, wherein the first segmented lamp and the third segmented lamp are each a third distance from the first plane.

7. The system of claim 2, further comprising a plurality of linear lamps parallel to the first segmented lamp, wherein
   each linear lamp includes a filament extending from a first end to a second end, wherein the first end and the second end of each linear lamp are each connected to the housing, and
   the plurality of segmented lamps and the plurality of linear lamps are positioned in an alternating sequence along a first direction in which a linear lamp of the plurality of linear lamps is positioned between each segmented lamp and a next segmented lamp in the first direction.

8. The system of claim 7, wherein each segmented lamp of the plurality of segmented lamps and each linear lamp of the plurality of linear lamps are located at a third distance from the first plane.

9. The system of claim 7, wherein each linear lamp is located at a third distance from the first plane and the first segmented lamp is located at a fourth distance from the first plane, wherein the third distance is longer than the fourth distance.

10. A system for thermal processing of a substrate comprising:
   a substrate support;
   a housing positioned over the substrate support and having a first edge surrounding a first plane; and
   an arrangement of lamps located within the housing and disposed across an area facing the first plane, the area defined by a boundary, wherein the arrangement comprises a plurality of segmented lamps, each segmented lamp having a bulb extending linearly from a location on the boundary to an opposing location on the boundary, wherein each segmented lamp includes a midpoint, a first filament on a first side of the midpoint, a second filament on a second side of the midpoint, a first wire segment extending between a location on the boundary and the first filament, and a second wire segment extending between a location on the boundary and the second filament, wherein:
      the first filament extends from a first endpoint to a second endpoint,
      the second filament extending from a first endpoint to a second endpoint,
      the plurality of segmented lamps includes a first segmented lamp and a second segmented lamp,
      the first wire segment and the second wire segment of the first segmented lamp are configured to overlie an edge of the substrate disposed on the substrate support, the substrate having an outer ring-shaped zone in which the edge of the substrate is located and an inner ring-shaped zone, the outer ring-shaped zone surrounding the inner ring-shaped zone,
      the first endpoint and the second endpoint of the first filament and the second filament of the first segmented lamp are configured to overlie the inner ring-shaped zone of the substrate disposed on the substrate support, and
      the first endpoint and the second endpoint of the first filament and the second filament of the second segmented lamp are configured to overlie the outer ring-shaped zone of the substrate disposed on the substrate support.

11. The system of claim 10, wherein the plurality of segmented lamps are aligned parallel to each other, and the arrangement of lamps is oriented to direct heat towards the substrate through the first plane.

12. The system of claim 11, wherein each segmented lamp includes an intermediate wire connecting the first filament to the second filament.

13. The system of claim 12, wherein the first and second filaments of the segmented lamps are arranged in a plurality of zones including the inner ring-shaped zone, wherein the inner ring-shaped zone includes four filaments from two segmented lamps, wherein the four filaments include the first and second filaments from the first segmented lamp of the plurality of segmented lamps and the first and second filaments from a third segmented lamp of the plurality of segmented lamps.

14. The system of claim 13, wherein the four filaments are equidistant from a center of the arrangement of lamps.

15. The system of claim 11, wherein the arrangement of lamps further comprises a plurality of linear lamps, wherein each linear lamp is parallel to each segmented lamp and includes a filament extending from a first end to a second end of the linear lamp, wherein the first end and the second end of each linear lamp are disposed at opposing locations on the boundary.

16. The system of claim 15, wherein each linear lamp and each segmented lamp are located at a third distance from the first plane.

17. The system of claim 15, wherein each linear lamp is located at a third distance from the first plane and each segmented lamp is located at a fourth distance from the first plane, wherein the third distance is longer than the fourth distance.

18. A thermal processing chamber for processing a substrate comprising:
   one or more side walls surrounding a processing region;
   a substrate support within the processing region, the substrate support having a substrate supporting surface;
   a transparent window disposed above the one or more side walls; and
   a lamphead disposed above the transparent window; the lamphead comprising a housing; and
      a plurality of segmented lamps disposed within the housing, each segmented lamp aligned parallel to the substrate supporting surface of the substrate support, wherein each segmented lamp comprises:
         a first end connected to a first location on the housing;
         a first wire segment connected to the first end;
         a first filament connected to the first wire segment, the first filament extending from a first endpoint to a second endpoint;
         an intermediate wire segment connected to the first filament;
         a second filament connected to the intermediate wire segment, the second filament extending from a first endpoint to a second endpoint;
         a second wire segment connected to the second filament;
         a second end connected to the second wire segment; and
         a bulb extending linearly from the first end to the second end, wherein
         the second end is connected to a second location on the housing,
         each segmented lamp is connected to a separate first location and a separate second location on the housing,
         the plurality of segmented lamps includes a first segmented lamp and a second segmented lamp,
         the first wire segment and the second wire segment of the first segmented lamp are configured to overlie an edge of the substrate disposed on the substrate support, the substrate having an outer ring-shaped zone in which the edge of the substrate is located and an inner ring-shaped zone, the outer ring-shaped zone surrounding the inner ring-shaped zone, and
         the first endpoint and the second endpoint of the first filament and the second filament of the first segmented lamp are configured to overlie the inner ring-shaped zone of the substrate disposed on the substrate support, and the first endpoint and the second endpoint of the first filament and the second filament of the second segmented lamp are configured to overlie the outer ring-shaped zone of the substrate disposed on the substrate support.

19. The thermal processing chamber of claim 18, wherein the first and second filaments of the segmented lamps are arranged in a plurality of zones including the inner ring-shaped zone, wherein the inner ring-shaped zone includes four filaments from two segmented lamps, wherein the four filaments include the first and second filaments from the first segmented lamp and the first and second filaments from a third segmented lamp of the plurality of segmented lamps.

20. The thermal processing chamber of claim 19, wherein the lamphead further comprises a plurality of linear lamps, wherein each linear lamp of the plurality of linear lamps is parallel to each segmented lamp of the plurality of segmented lamps and each linear lamp of the plurality of linear lamps includes a filament extending from a first end to a second end, wherein the first end and second end of each linear lamp are each connected to the housing.

* * * * *